United States Patent
Chao et al.

(10) Patent No.: US 6,784,685 B2
(45) Date of Patent: Aug. 31, 2004

(54) TESTING VIAS AND CONTACTS IN AN INTEGRATED CIRCUIT

(75) Inventors: Tai-An Chao, San Jose, CA (US); Zicheng Gary Ling, San Jose, CA (US); Shihcheng Hsueh, Fremont, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 10/264,207

(22) Filed: Oct. 3, 2002

(65) Prior Publication Data

US 2003/0025516 A1 Feb. 6, 2003

Related U.S. Application Data

(62) Division of application No. 09/920,237, filed on Jul. 31, 2001, now Pat. No. 6,503,765.

(51) Int. Cl.[7] .............................................. G01R 31/02
(52) U.S. Cl. ................................... 324/765; 324/158.1
(58) Field of Search ........................ 257/48, 369, 536; 324/774, 765, 716, 719, 500, 537, 158.1; 438/14, 17, 18

(56) References Cited

U.S. PATENT DOCUMENTS

| | | | |
|---|---|---|---|
| 5,648,661 A | * | 7/1997 | Rostoker et al. ............... 257/48 |
| 5,770,995 A | | 6/1998 | Kamiya |
| 5,838,161 A | | 11/1998 | Akram et al. |
| 5,962,868 A | | 10/1999 | Tanida |
| 6,057,171 A | * | 5/2000 | Chou et al. .................... 438/15 |
| 6,175,125 B1 | | 1/2001 | Tsai |
| 6,218,848 B1 | | 4/2001 | Hembree et al. |
| 6,281,696 B1 | * | 8/2001 | Voogel ........................ 324/765 |
| 6,362,638 B1 | * | 3/2002 | Ashton et al. ............... 324/755 |
| 6,503,765 B1 | * | 1/2003 | Chao et al. .................... 438/14 |

FOREIGN PATENT DOCUMENTS

| | | |
|---|---|---|
| EP | 0 430 372 A1 | 11/1990 |
| JP | 10 135 412 | 5/1998 |

* cited by examiner

*Primary Examiner*—Vinh P. Nguyen
(74) *Attorney, Agent, or Firm*—H. C. Chan; Kim Kanzaki

(57) ABSTRACT

A test arrangement is designed to test whether one in a chain of vias or contacts has abnormally high resistance. The arrangement contains a plurality of via or contact chains and a plurality of decoders. The chains are switchably connected to a resistance measurement device. Each decoder has a unique address such that it will generate a control signal when a predetermined address is address thereon. The control signal is used to close a switch, which connect one of the chains to the resistance measurement device. By sequentially applying different addresses to the decoders, the resistance of the chains can be individually measured.

7 Claims, 5 Drawing Sheets

TESTING VIAS AND CONTACTS IN AN INTEGRATED CIRCUIT

FIELD OF THE INVENTION

This invention relates to integrated circuit (IC) fabrication processes, and in particular to methods and test circuits for identifying and locating defective vias and contacts during IC fabrication process.

BACKGROUND OF THE INVENTION

Integrated Circuit (IC) devices typically include numerous electrical and/or electronic elements that are fabricated on, for example, silicon wafers to perform a particular function. The sequence of steps that occur in the course of manufacturing an IC device can be grouped into two phases: 1) the design phase, and 2) the fabrication phase.

The design phase begins by deciding upon the desired functions and necessary operating specifications of the IC device. The IC device is then designed from the "top down"; that is, large functional blocks are first identified, then sub-blocks are selected, and then the logic gates needed to implement the sub-blocks are chosen. Each logic gate is designed through the appropriate connection of, for example, transistors and resistors. The logic gates and other circuit components are then combined to form schematic diagrams. After the various levels of design are completed, each level is checked to insure that correct functionality is achieved, and then test vectors are generated from the schematic diagrams. Next, the circuit is laid out. A layout consists of sets of patterns that will be transferred to the silicon wafer. These patterns correspond to, for example, the formation of transistors and interconnect structures. The layout is designed from the "bottom up"; for example, basic components (e.g., transistors) are first laid out, then logic gates are created by interconnecting appropriate basic components, forming the logic gates into sub-blocks, and finally connecting appropriate sub-blocks to form functional blocks. Power busses, clock-lines, and input-output pads required by the circuit design are also incorporated during the layout process. The completed layout is then subjected to a set of design rule checks and propagation delay simulations to verify that a correct implementation of the circuit design has been achieved. After this checking procedure, the layout is used to generate a set of masks that are used during the fabrication phase to specify the circuit patterns on the silicon wafer.

Specifically, the fabrication phase includes a sequence of process steps during which the set of masks are used to transfer the layout patterns onto a silicon wafer using photolithographic and film formation processes. The process parameters (e.g., temperature, pressure, deposition rates and times, etch rates and times) associated with the process steps are typically developed and refined during an initial development stage. These refined process parameters are then used to produce a final fabrication process that is used during IC production runs.

There may be defects in the fabrication process. In order to identify the precise structural nature of defects caused by non-optimal process parameters, test structures are formed on the wafer. By studying these test structures, it is possible to improve and refine the fabrication process. These test structures are necessary as the physical nature of these defects cannot be discerned from output data of the ICs. Specifically, defects in the ICs produce functional errors in the output data. These functional errors provide little or no information to identify the physical structure causing the defect. As explained in detail below, even with test structures, information about the exact location and nature of the defect is still not readily obtainable. Thus, failure analysis remains difficult and time consuming.

One type of structure in a wafer that needs to be tested is contacts and vias. Currently, they are tested by measuring the resistance of a long chain comprising a few thousand connected vias/contacts. Typically, a tester having a resistance measuring device is used for the measurement. A prober of the test system provides connection between the tester and the chain under test. An open via/contact can be easily identified because the measured resistance of the chain is much higher than the expected resistance for a chain of regular vias/contacts. However, it is very difficult to identify a high resistance via/contact that has a few hundred ohms (as opposed to a regular via that has a resistance of about 10 ohms) in a long chain of vias/contacts. This is because the resistance of a chain of non-defective vias/contacts is more than ten thousand ohms, and has a normal variation of resistance of 5% to 10%. The resistance of such a high resistance via/contact is within the "noise" variation of the resistance of a long chain.

One way to increase the accuracy of resistance measurement is to reduce the number of vias in a chain. For example, if a chain contains about one hundred vias, the resistance of the chain is approximately one thousand ohms. Thus, the presence of a high resistance via (having a resistance of, say, two hundred ohms) in the chain can be easily detected because the resistance of the chain is increased by 20%, which is beyond the noise level. As the chain becomes shorter, more chains need to be tested so as to cover the same number of vias. This means that the prober needs to be mechanically moved many times from one via chain to another. The problem of this approach is that it could slow down the testing process because of the increasing number of slow mechanical operations caused by short via chains.

Another test structure is the so called "drop in" structure. FIG. 1 is a plan view showing a conventional semiconductor test wafer 100 including circuit ICs (shown as reference numeral 110) and conventional drop-in test structures (shown as reference numerals 112). Conventional test structure 112 is used to detect defects associated with the various conductive materials that are fabricated during the various process steps.

One problem of the drop-in structure is that they are relatively large. It is known that wafer area is very valuable and expensive. Thus, it is not desirable to place on production wafers large drop-in test structures for monitoring contacts and vias.

What is needed is an improved test circuit and method that can readily and reliably identify and isolate fabrication defects in vias and contacts, thereby facilitating rapid development and refinement of the fabrication process steps necessary to manufacture IC devices.

SUMMARY OF THE INVENTION

The present invention is directed to a method and a test circuit that provide rapid identification of process problems, detect defects down to less than a few parts-per-million level, and identify the precise location of any defects, thereby facilitating rapid failure analysis. A tester having a resistance measurement device is used to measure the resistance of chains of vias. In the present invention, one or more circuit arrangements are fabricated on a semiconductor wafer. The arrangement contains a plurality of chains of connected vias, contacts and a plurality of decoders. Each decoder is associated with one of the via chains. Each decoder also has a set of address lines. When a predetermined address is presented to the address line, the decoder causes its associated via chain to be connected to the resistance measurement device. In order for the via chains to be measured one at a time, each decoder has a unique predetermined address. By sequentially applying different predetermined addresses to the decoders, all the via chains can be sequentially connected to the resistance measurement device so that the resistance of all the chains can be individually measured.

In one embodiment, a Kelvin resistance measurement device is used to measure the resistance of the chains. One advantage is that the parasitic resistance in the supporting circuit elements, probe card, and cable can be rendered negligible.

In another embodiment, the decoders are designed to use N-channel transistors only. These transistors can be fabricated under most CMOS processes without the need to modify the implant data of the design. As a result, many foundries can use the test circuit of the present invention to improve their fabrication processes.

The above summary of the present invention is not intended to describe each disclosed embodiment of the present invention. The figures and detailed description that follow provide additional example embodiments and aspects of the present invention.

BRIEF DESCRIPTION OF THE DRAWINGS

The present invention is illustrated by way of example, and not by way of limitation, in the detailed description and the following figures, in which like reference numerals refer to similar elements.

DETAILED DESCRIPTION OF THE INVENTION

The present invention relates to method and circuit for identifying fabrication process problems. In the following description, numerous specific details are set forth in order to provide a more thorough understanding of the present invention. However, it will be apparent to one skilled in the art that the present invention may be practiced without these specific details. In other instances, well-known features have not been described in detail in order to avoid obscuring the present invention.

Figure 2:
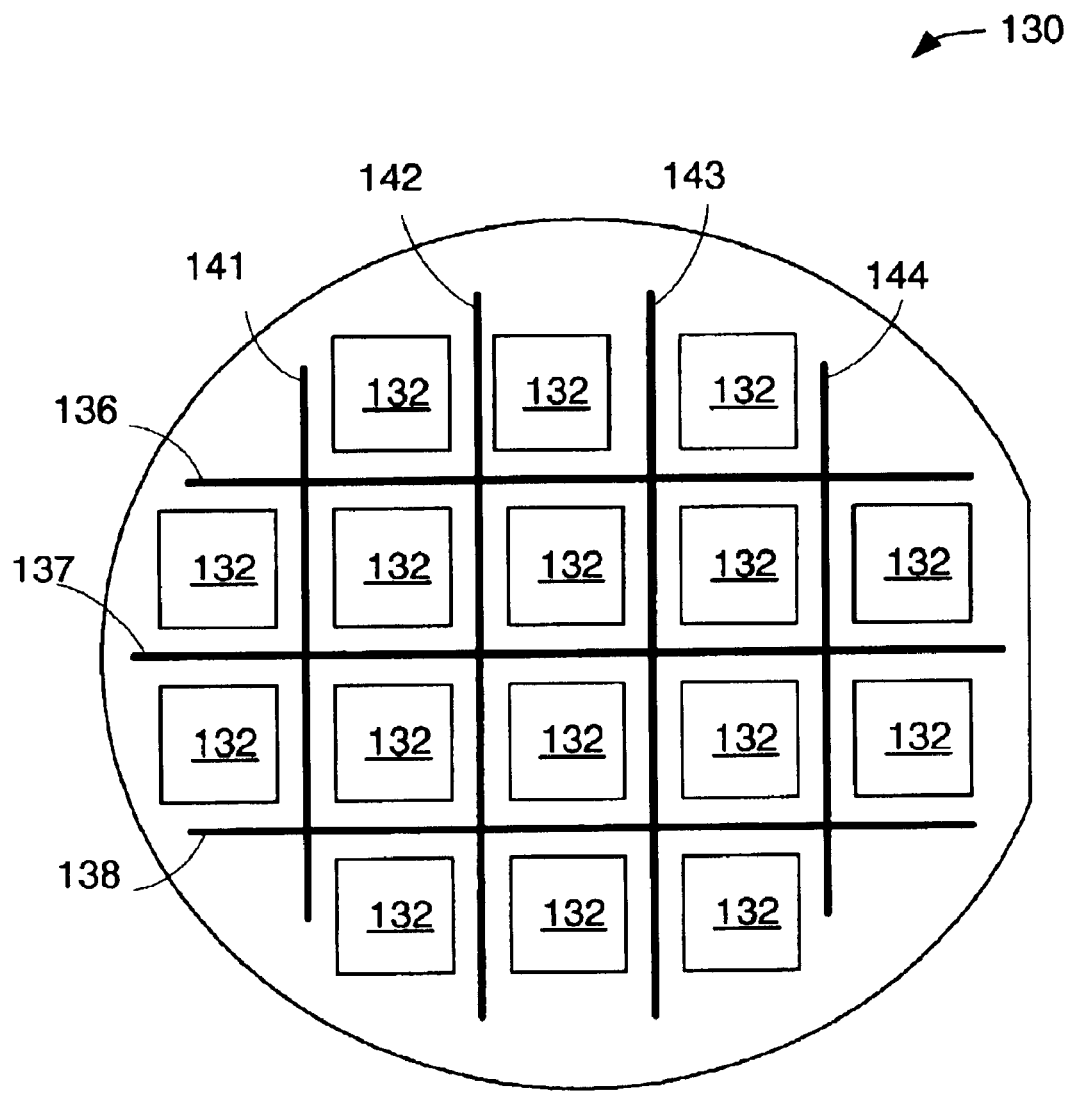
FIG. 2 shows a semiconductor wafer including ICs and scribe lines that contain test circuits of the present invention.

FIG. 2 is a diagram illustrating the arrangement of ICs and the test circuits on a semiconductor wafer 130 in accordance with an embodiment of the present invention. Wafer 130 includes several IC regions 132 that are fabricated in rows and columns on a surface thereof. Each IC region 132 may include one or more ICs, such as application specific ICs (ASICs), programmable logic devices (PLDs)), and test circuits. Wafer 130 further contains a plurality of scribe lines, such as lines 136–138 and 141–144. Although the test circuits of the present invention could be implemented anywhere on wafer 130, they are preferably implemented along the scribe lines. As a result, there is no need to use valuable IC regions for the test circuits of the present invention.

The present invention is applicable to both via chain and contact chain measurement. In the present disclosure, the focus is on via chains so as to simplify the description. The same method and apparatus can be applied to contact chains.

Figure 3:
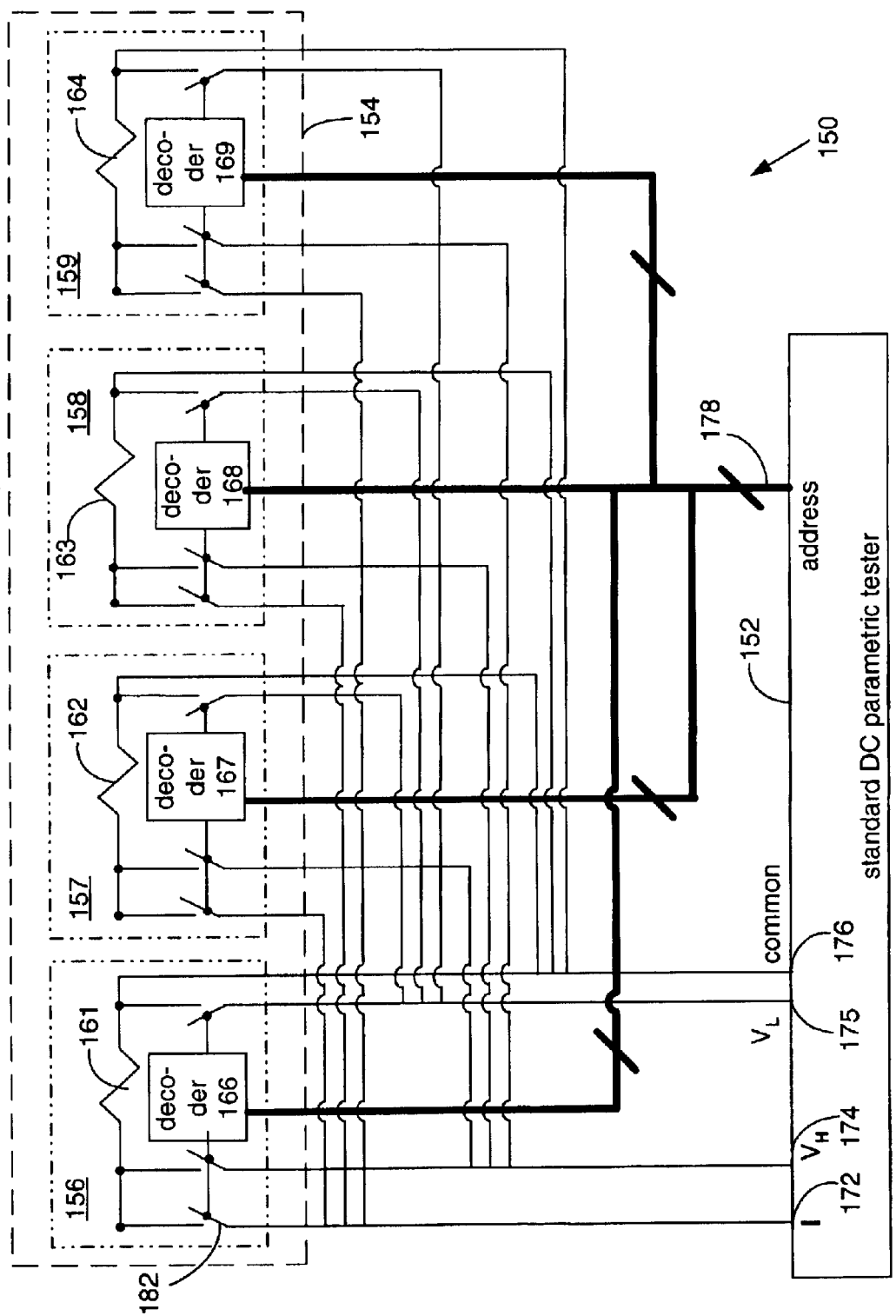
FIG. 3 is a schematic diagram of a test arrangement of the present invention.

FIG. 3 is a schematic diagram of a test arrangement 150 in accordance with the present invention. It shows a standard DC parametric tester 152 connected to a plurality of test circuits 156–159 fabricated on a scribe line 154. Parametric tester 152 contains a prober that uses a probe card having a plurality of pins. These pins provide connection between the signal terminals of parametric tester 152 and the test circuits on a wafer. Each test circuit contains a chain of connected vias and a decoder. For example, circuits 156–159 contain via chains 161–164 and decoders 166–169, respectively. The decoders 166–169 are used to selectively connect their respective via chains to parametric tester 152. In FIG. 3, the first ends of via chains 161–164 are selectively connected to a current terminal 172 and a voltage-sense (high) terminal 174 of parametric tester 152 through a plurality of switches controlled by decoders 166–169. The second ends of via chains 161–164 are selectively connected to a voltage-sense (low) terminal 175 of parametric tester 152 through another set of switches controlled by decoders 166–169. The second ends of via chains 161–164 are also connected to the common terminal 176 of parametric tester 152. In FIG. 3, only one of the switches is labeled with a reference numeral (182) so as not to cluster the drawing with labels. The address lines of decoders 166–169 are coupled together to form a bus 178, which is connected to a switching matrix (not shown) of parametric tester 152. The address lines in bus 178 can be individually set to logic high or logic low states (e.g., by using switching relays in parametric tester 152 to connect or disconnect to a voltage). Through this bus, parametric tester 152 can activate one of the decoders to selectively connect one of the via chains for resistance measurement.

Although FIG. 3 shows only four test circuits, a large number of test circuits can be fabricated on a scribe line. The number of vias in a via chain is preferably less than one hundred, and is most preferably around ten to twenty. If the number of vias is around twenty, the resistance of a via chain without any defective via is about a few hundred ohms. This allows vias with resistance larger than fifty ohms to be easily detected.

One aspect of the present invention is that the size of the test circuits can be small. Depending on the number of pins on the probe card, it may be possible to have more than 128 test circuits on a single scribe line module.

In one embodiment, an automatic parametric tester, such as Model Number S600 marketed by Keithley, is used as tester 152. For our experimental setup, this tester is used to control seven address lines. Consequently, up to 128 test circuits can be tested in one connection between tester 152 and the test circuits. Note that different fabrication foundries may use different kinds of probe cards that have different number of pins, thereby controlling different number of address lines. In many cases, the number of address lines is determined by the number of pins of a probe card used by a parametric tester. The seven address lines are used to sequentially cause one of the 128 decoders to close switches between its associated via chain and terminals 172, 174 and 175 of tester 152 for resistance measurement. After the resistance of one chain is measured, the next chain can be selected for measurement by applying another address to the address bus. Assuming that each via chain contains 16 vias, this arrangement allows 2,048 vias to be tested in one contact between tester 152 and the 128 via chains. No additional physical motion of the prober is needed for the testing.

Figure 1:
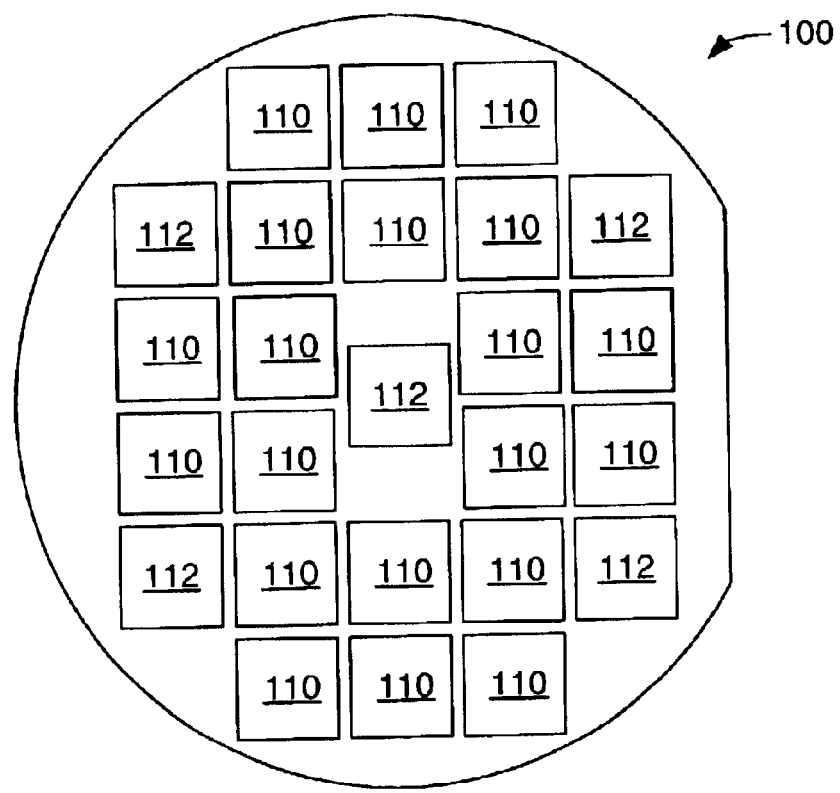
FIG. 1 shows a conventional semiconductor wafer including circuit ICs and conventional test circuits.
Figure 4:
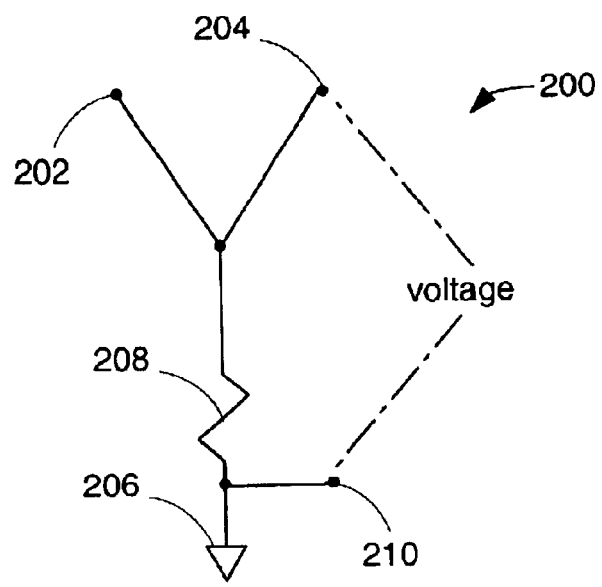
FIG. 4 is a schematic diagram showing a Kelvin resistance arrangement that can be used in the present invention.

The resistance measurement is preferably performed using a Kelvin configuration. On advantage of a Kelvin configuration is that the parasitic resistance in the supporting circuit elements, probe card and cable can be rendered negligible. FIG. 4 is a schematic diagram showing a Kelvin configuration 200 that can be used to accurately measure the resistance of a resistor 208. It contains four terminals: a terminal 202 for accepting a current, a common terminal 206, and two terminal 204 and 210 for measuring the voltage across resistor 208. The resistance is obtained as a quotient of the measured voltage and the supplied current. In the present embodiment, terminals 202, 204, 206 and 210 of FIG. 4 correspond to terminals 172, 174, 176 and 175 and of tester 152 of FIG. 3.

It should be noted that other high precision resistance measurement devices may be used in the present invention. The number of terminals in these resistance measurement devices may be different from four. In this case, the connection between the test circuits and the parametric tester can be appropriately modified. It should also be noted that even though a commercially available parametric tester is preferably used, the present invention can be performed by any tester that can generate addresses and measure resistance.

Figure 5:
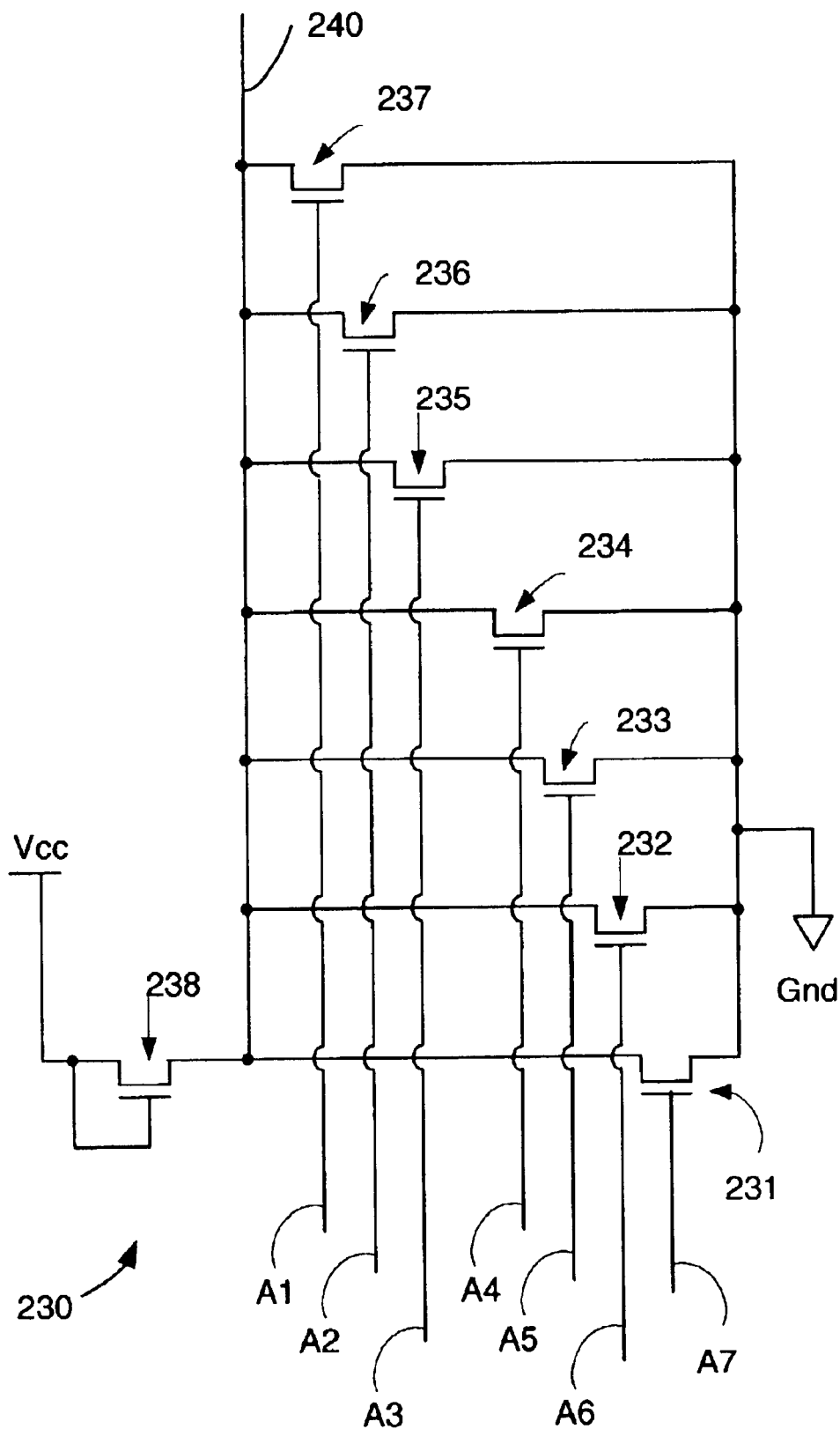
FIG. 5 is a schematic diagram of an exemplary decoder that can be used in the test arrangement of the present invention.

An exemplary decoder circuit 230 that can be used in the test arrangement 150 is shown in FIG. 5. It contains a pull-up transistor 238 and a plurality of switching transistors 231–237. The gate terminal of each switching transistor is connected to one of the address lines A1–A7. It should be noted that the number of address lines is determined by the number of pads in a PCM (process control and monitoring) test module, and the present invention is applicable to any number of address lines. One terminal of each switching transistor is connected to ground and the other terminal is connected to a control line 240. This control line is used to control the switches of test circuits 156–159. Control line 240 is normally at the same voltage level as Vcc (minus a voltage drop caused by pull-up transistor 238). However, when a predetermined address is applied to address lines A1–A7, control line 240 is switched to ground level. This signal is used to close its associated switches for connecting its associated via chain to the Kelvin configuration.

The test circuits of the present invention is designed using only N-channel transistors. These transistors can be fabricated under most CMOS processes without the need to modify the implant data of the design. As a result, many types of foundries can use the test circuit of the present invention to improve their fabrication processes.

Figure 6:
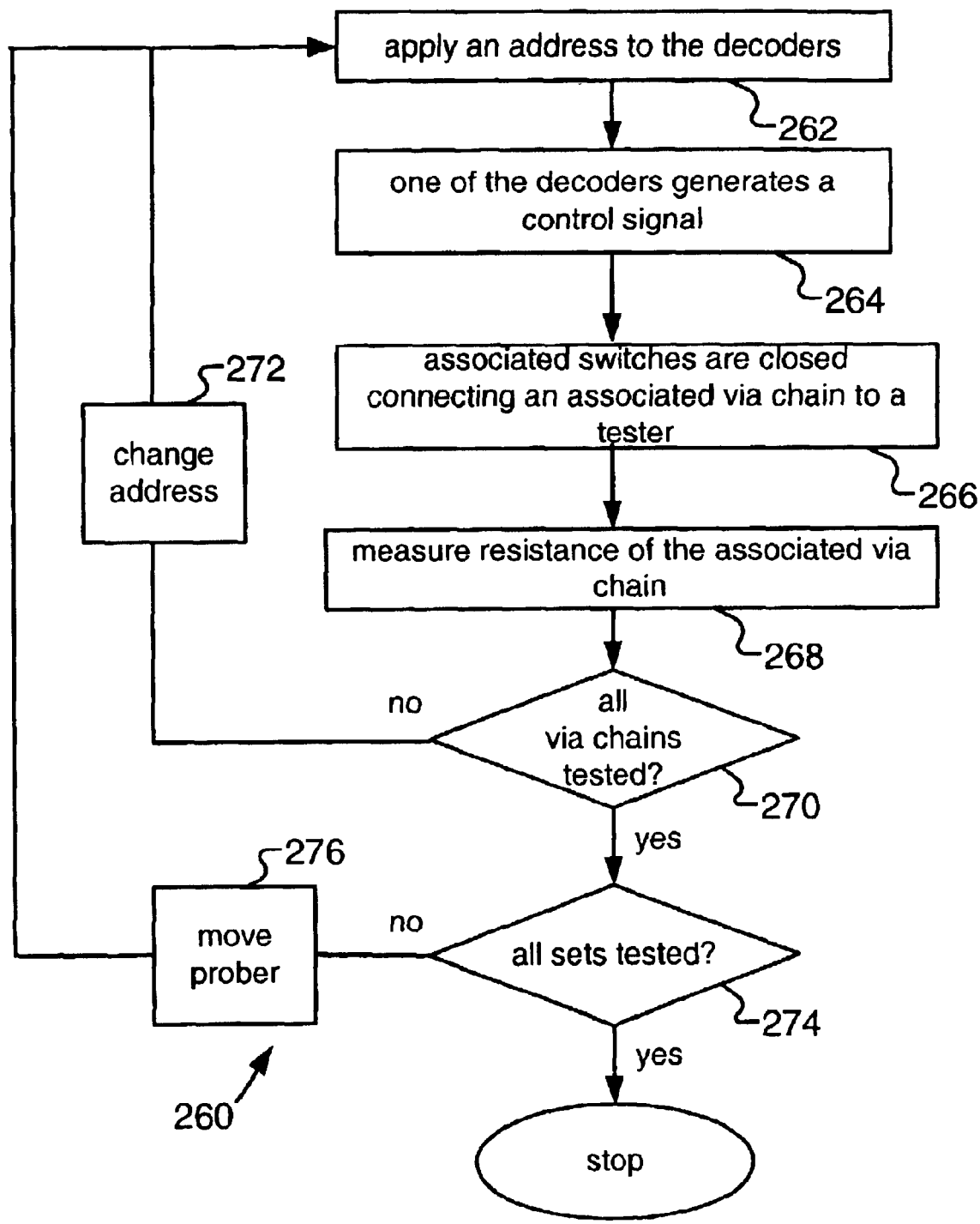
FIG. 6 is a flow chart showing an operation of the present invention.

A flow chart showing the operation 260 of the present invention is shown in FIG. 6. At step 262, the tester applies an address to the decoders. One of the decoders is selected, and it generates a control signal (step 264). At step 266, three switches associated with the selected decoder are closed in response to the control signal. As a result, an associated via chain is connected to the resistance measurement device of the tester. At step 268, the resistance measurement device measures the resistance of the via chain associated with the selected decoder. At step 270, operation 260 determines whether all the via chains have been measured. If not all the chains have been measured, another address is applied to the address bus (step 272). The above-described steps are repeated. If all the chains have been measured, operation 260 determines whether additional sets of via chains need to be tested (step 274). If no more set of via chains need to be tested, operation 260 terminates. If another set of via chains need to be tested, the prober is moved to the corresponding set of test module (step 276). The above resistance measurement steps are repeated for the new set of test circuits.

In one embodiment, the via chains are arranged in multiple straight lines. This arrangement makes the via chains to be easily cross-sectioned for failure analysis. Thus, if a via chain is determined by the present invention to contain defective vias, the chain can be cut to examine the cause of the defect.

One advantage of the present invention is that commercially available DC parametric testers and prober may be used to perform Kelvin resistance measurement and control the address lines of the decoders. There is no need to use specialized test equipment. As a result, the testing of the present invention can be included in regular production PCM tests. These PCM tests are performed routinely at foundry's wafer fabs. As a result, the reliability of the fabrication process can be improved.

Although the present invention has been described in considerable detail with reference to certain preferred embodiments thereof, other embodiments are possible. Therefore, the spirit and scope of the appended claims should not be limited to the description of the preferred embodiments contained herein.

I claim:

1. A circuit arrangement on a semiconductor wafer for identifying defects associated with fabrication of the semiconductor wafer, the circuit arrangement comprising a plurality of test circuits, each test circuit comprising:
    a chain of connected vias or contacts;
    an addressable decoder associated with the chain of connected vias or contacts and having a set of address lines; and
    a first switch controlled by the decoder to selectively connect the chain of connected vias or contacts to a first terminal of a resistance measurement device.

2. The circuit arrangement of claim 1 wherein the decoder is fabricated on CMOS process.

3. The circuit arrangement of claim 2 wherein the decoder comprises a plurality of switching transistors, the plurality of switching transistors being in a first state when a predetermined logic signal is applied to gates terminals of the switching transistors and in a second state otherwise.

4. The circuit arrangement of claim 3 wherein each of the transistors in the decoder is fabricated on CMOS process.

5. The circuit arrangement of claim 1 wherein the resistance measurement device is a four terminal device.

6. The circuit arrangement of claim 5 wherein the each test circuit further comprises a second and a third switch controlled by the decoder to selectively connect the chain of connected vias or contacts to a second and a third terminal, respectively, of the resistance measurement device.

7. The circuit arrangement of claim 5 wherein the resistance measurement device is a Kelvin device.

* * * * *